United States Patent
Merkle

(10) Patent No.: US 7,459,911 B2
(45) Date of Patent: Dec. 2, 2008

(54) METHOD FOR DETECTING THE CONNECTION BETWEEN THE ENERGY STORAGE MECHANISM AND THE ELECTRICAL SYSTEM OF A VEHICLE

(75) Inventor: Michael Merkle, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 514 days.

(21) Appl. No.: 11/173,516

(22) Filed: Jul. 1, 2005

(65) Prior Publication Data
US 2006/0028180 A1 Feb. 9, 2006

(30) Foreign Application Priority Data
Jul. 22, 2004 (DE) .................. 10 2004 035 513

(51) Int. Cl.
*G01N 27/42* (2006.01)
*G01N 27/416* (2006.01)
(52) U.S. Cl. ............... 324/426; 324/425; 320/104; 320/109; 320/134; 320/162; 320/165
(58) Field of Classification Search ............ 324/426, 324/439, 425; 320/104, 162, 109, 134, 165
See application file for complete search history.

(56) References Cited

U.S. PATENT DOCUMENTS 6,469,475 B2 * 10/2002 Pawlik ............... 320/134

| | | | |
|---|---|---|---|
| 2003/0025506 A1* | 2/2003 | Arai | 324/426 |
| 2003/0038637 A1* | 2/2003 | Bertness et al. | 324/426 |
| 2003/0169049 A1* | 9/2003 | Kawaguchi et al. | 324/426 |
| 2006/0052918 A1* | 3/2006 | McLeod et al. | 701/29 |

FOREIGN PATENT DOCUMENTS

| | | |
|---|---|---|
| DE | 199 64 057 | 7/2001 |
| DE | 101 42 085 | 3/2003 |
| DE | 101 50 381 | 4/2003 |
| DE | 102 19 824 | 11/2003 |
| WO | WO 98/20594 | 5/1998 |

* cited by examiner

*Primary Examiner*—AKm Enayet Ullah
*Assistant Examiner*—Johali A Torres Ruiz
(74) *Attorney, Agent, or Firm*—Kenton & Kenyon LLP

(57) ABSTRACT

A method for detecting the state of electrical connection of an energy store, e.g., a battery, to a vehicle's electrical system includes ascertaining operating variables, e.g., battery current $I_B$ and generator current $I_G$, essentially in time synchronous fashion. When there is a change in the generator current $I_G$ of the generator during a transitional time, the energy store is checked for the value of the battery current $I_B$ for the detection of a compensating effect in the form of a current delivery or a current consumption.

10 Claims, 1 Drawing Sheet

METHOD FOR DETECTING THE CONNECTION BETWEEN THE ENERGY STORAGE MECHANISM AND THE ELECTRICAL SYSTEM OF A VEHICLE

FIELD OF THE INVENTION

The present invention relates to a method for detecting the connection between the energy-storage mechanism and the electrical system of a vehicle.

BACKGROUND INFORMATION

In order to ensure the availability of electrical loads in electrical systems of motor vehicles, especially in the case of applications that are critical to safety in motor vehicles, the energy storage mechanisms (also referred to as "energy stores") for supplying these electrical systems are monitored continuously with respect to their performance and/or available load or energy, as well as with respect to the state of ageing and the state of soundness. The basic assumption for making available electrical energy by energy stores is a qualitatively high-grade galvanic connection to the wiring harness and the body sheet of the vehicle.

In order to ensure safety during vehicle operation, a complete loss of the energy store, e.g., a vehicle battery, in the vehicle has to be identified and indicated, e.g., within the scope of a warning report. The loss of the energy store, e.g., a motor vehicle battery, may be caused by several reasons. For instance, a breakage of the conducting connection between the negative pole and the vehicle body may have occurred; a breakage of the pole shoe or the cell connector in the battery may have occurred; the battery terminal clamp may have become detached from the battery terminal; or a cable starting from the positive clamp may have become detached. These occurrences may prevent the use of the energy potential in the energy store.

In methods known from the prior art for monitoring an energy store, e.g., a motor vehicle battery, measurements of the battery voltage, the current and the temperature are performed, using inductive or ohmic battery sensors.

According to one method described in published German patent document DE 101 42 085, a diagnosis of the electrical system of a motor vehicle is made, the electrical system voltage being recorded and its ripple curve being evaluated. A method described in published international patent document WO 98 205 94 provides that an interruption is detected in the connection between the energy store and the vehicle's electrical system. According to published international patent document WO 98 205 94, the impedance of the electrical system is evaluated and viewed from the point of view of the battery.

Both of the above-described methods assume frequent measurements of variables such as the clamp voltage and the clamp current, and require a calculation of the quotient of the absolute and/or differential voltage and current values. Accordingly, the above-described methods also require a relatively high calculating capacity, conditioned by a high scanning rate. According to the method described in published international patent document WO 98 205 94, the impedance of the entire electrical system of a vehicle is determined from the point of view of the energy store, i.e., the motor vehicle battery. An increase of the impedance in the electrical system of the motor vehicle above a threshold value is regarded as an indication of an interruption of the electrical connection between the energy store and the motor vehicle.

A method and a device for providing safety measures against failure of the vehicle electrical system are described in published German patent document DE 101 50 381. According to this published German patent document, the vehicle electrical system is fed by at least one battery and one generator. In order to guarantee the stability of the electrical system, the energy sources are constantly monitored, and when there is a defect in, or a strongly diminished performance of, one of the energy sources, an active intervention in the driving operation of the vehicle is made in order to avoid the complete failure of the effected components during travel. For this, the maximum rotary speed of an internal combustion engine of a vehicle may be limited, or the vehicle may be braked to a complete standstill.

Published German patent document DE 199 64 057 describes a method for detecting a defective motor vehicle battery. When the engine of the vehicle is running, the battery is charged by a generator to an increased voltage setpoint value that is pre-specified by a control unit, and the battery is subsequently discharged by an electrical load. The difference in voltage that comes about during charging and discharging within a time interval, i.e., the time interval that expires up to the reaching of two voltage threshold values, is evaluated as an indicator for the operating state of the battery, i.e., as an indicator for its storage performance. The evaluation takes place by recording the voltage gradient of a predefined curve that was previously ascertained in an empirical way. The result obtained is optically or acoustically indicated by an appropriate indicator.

Published German patent document DE 102 19 824 describes a method and a device for detecting an operation of an electrical system without battery-supplied energy. The electrical system includes: at least one generator driven by a motor; a battery; an electrical load connectible to the battery; and means for voltage evaluation. The generator voltage and the battery voltage are measured, and the voltage values ascertained are put in relationship to each other, and from the results obtained from this, one may conclude that there has been a malfunction of the battery or an interruption of the connection between the battery and the electrical system, and thus an occurrence of a battery-less operation. Both the ripple of the generator voltage and the ripple of the electrical system are ascertained, and the two ripples ascertained are put in relationship to each other. When there is a deviation of the ascertained ripple from pre-defined boundary values, this also leads to the conclusion that a battery-less operation is occurring. A device for carrying out the method described in the published German patent document DE 102 19 824 includes means for voltage evaluation, which in turn may include at least one band-pass and/or means for instantaneous peak value measurement and/or means for maximum and minimum determination of voltages. The means for the voltage evaluation measures both the generator voltage and the battery voltage.

SUMMARY

In accordance with the method of the present invention, during a travel operation of a vehicle having an electrical system, a rapid and reliable detection is ensured as to whether the energy store, e.g., a vehicle battery, has a good galvanic connection to the body shell and to the wiring harness. Furthermore, in accordance with the method of the present invention, it is ascertained whether a sudden defect within the energy store, such as breakage of the pole shoe or the like, has occurred, and whether the functioning of the energy store is decisively impaired.

In accordance with the method of the present invention, information is also generated that is suitable as an essential security assumption for the operation of an electrical system, and thus for making safety-critical applications secure within an electrical system.

In accordance with the method of the present invention, an accurate and unequivocal determination is made as to whether there is a galvanic connection between the electrical system and the energy store, e.g., a vehicle battery. In addition, one may achieve a great reduction in the required calculating resources in comparison to the calculating resources required in accordance with the prior art for the ascertainment of an internal resistance of an energy store. Furthermore, one may do without a voltage measurement, thereby reducing the apparatus expenditure associated with voltage measurement. It is also possible to monitor several energy stores tied into the electrical system of a vehicle, and to identify selectively failed energy stores, as well as identify suddenly occurring faults in the contacting. Since the method according to the present invention does not rely on the determination of the internal resistance of an energy store, e.g., a lead-acid battery, this method may be also applied to various types of energy store, such as capacitors.

By using the method according to the present invention, an active intervention in the electrical system, i.e., using electrical energy management, is not necessary, so that, for instance, the switching on and off of electrical loads may be eliminated.

DETAILED DESCRIPTION

Figure 1:
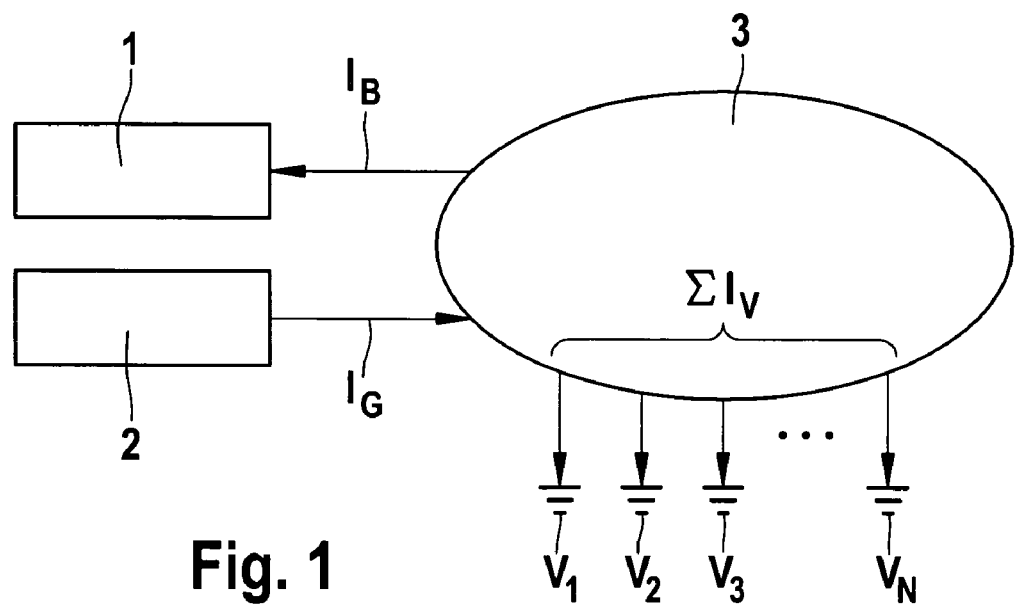
FIG. 1 is a schematic illustration of the structure of the electrical system of a motor vehicle.

The structure of an electrical system of a vehicle is schematically illustrated in FIG. 1, which electrical system includes, for example, an energy storing mechanism 1, which is usually implemented as a vehicle battery. However, in the following discussion, the concept of "energy store" should be understood as encompassing energy storing mechanisms different from a vehicle battery, such as capacitors or double-layer capacitors.

Electrical system 3 of a vehicle, represented schematically in FIG. 1, includes electrical loads $V_1, V_2, V_3 \ldots$ to $V_N$, as well as an energy store 1, e.g., the motor vehicle battery. In addition, to feed the electrical system 3, a generator 2, driven by the internal combustion engine not shown in FIG. 1, is provided. The generator may be, for example, a three-phase generator. Energy store 1 may be a lead-acid automobile battery. Generator 2 may have a generator regulator assigned to it. The electrical system 3 of a motor vehicle may include a variable number of electrical loads, as represented by load designation $V_N$.

In the discussion below, it is assumed that, for an "energy off" detection, the measuring values mentioned below are ascertained regularly and at an interval of several 10 ms, approximately synchronously, and are made available:
1. battery current $I_B$ of energy store 1 that is to be observed;
2. generator current $I_G$ or another measured variable that correlates with generator current $I_G$.

Battery current $I_B$ is generally made available via a battery sensor of a computer unit via a bus system, or is processed directly on the battery sensor so as to ascertain variables relevant to a battery diagnosis.

It may be provided that, via a data bus, both the data of the battery sensor such as battery current $I_B$ and the data of the generator, e.g., generator current $I_G$, may be transmitted to a common computer unit.

It should be noted that $\Sigma I_V$ shown in the illustration of FIG. 1 designates the sum of all user currents in electrical system 3 of the motor vehicle. The application of Kirchhoff's Law leads to the following mathematical relationship:

$$I_G = I_B + \Sigma I_V$$

If energy store 1 has no galvanic contact to the vehicle body, this, perforce, leads to:

$$I_B = 0$$

A battery sensor, provided within an electrical system, ideally gives $I_B=0$; usually, however, the output signal is an average-free noise. The condition may be checked about the value 0 by maintaining a tolerance threshold. However, the condition $I_B=0$, by itself, does not represent a sufficient condition for an "energy store off" detection, since a stationary state may definitely occur in which the sum of the electrical load powers is covered exactly by the power of generator 2, i.e., $I_G = \Sigma I_V$. In this steady state condition, $I_B=0$ also applies.

In order to reach a conclusion as to whether energy store 1 is cut off from electrical system 3, it is assumed that the electrical load power is not constant over a longer period of time. The change in the electrical load power takes place in travel operation continuously by switching procedures in the electrical system, such as the lighting up of brake lights during braking procedures, operation of electrical window lifters, activation of directional indicators, etc. Besides that, the irregular operation of electrical drives or electronic users (ignition) is responsible for a steady change in the electrical user power within electrical system 3 of the motor vehicle. The change described in the required electrical load power $\Delta P_V$ accordingly leads to a change in the required user power $\Delta P_V$ at an approximately constant voltage level within electrical system 3 to current changes $\Delta(\Sigma I_V)$.

Figure 2:
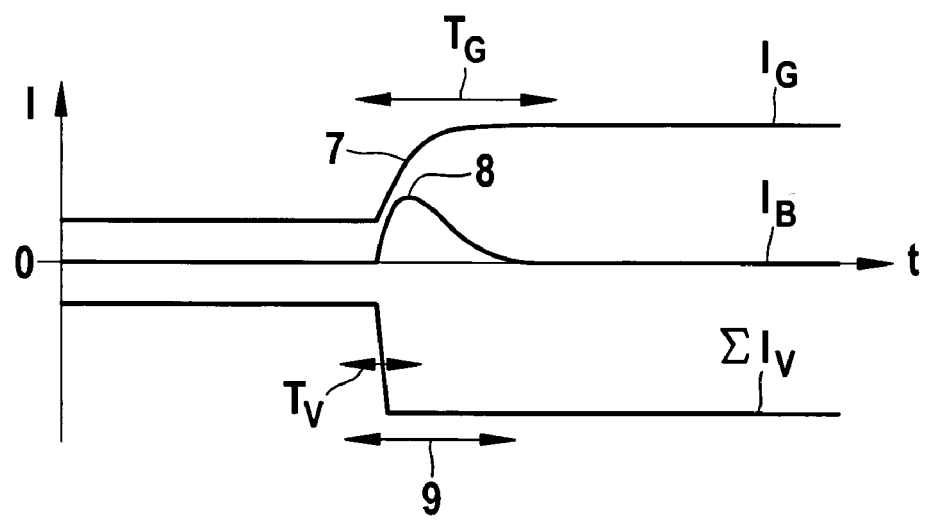
FIG. 2 is a graph illustrating example curves of variables, e.g., generator current, electrical load current and battery current, during a compensation procedure.

The results of such electrical load current changes are shown in FIG. 2, which shows example curves of variables, e.g., generator current $I_G$, user current $\Sigma I_V$ and battery current $I_B$, during a compensation procedure. The compensation in the change of the electrical load power by $\Delta P_V$ ideally takes place by a rapid compensation of the generator power, in order to cover the new usage required within electrical system 3. It is supposed that a change in the generator power at generator 2 takes place having a time constant that is predefined by the inertia of the electrical machine (i.e., the three-phase generator) and the controller assigned to it. Time constant $T_G$, let us assume, is of the order of magnitude between 200 to 400 ms. One may see from the illustration of FIG. 2 that directly upon a usage change (user dynamics) made recognizable through time constant $T_V$ in electrical system 3, at a time constant $T_V=10$ ms, the electrical power generated in generator 2 is not immediately equivalent to the electrical power used. During the compensation procedure indicated by reference numeral 9, the power difference in electrical system 3 is compensated for by an energy store, e.g., the vehicle battery 1.

This reveals that a change in generator current $I_G$, in order to cover a change in usage in electrical system 3, or based on the specification of a superordinated regulation, such as the electrical energy management in electrical system 3, within the transition time linked to the energy constant of generator 2 as well as the generator controller assigned to it, always leads to the fact that energy store 1 during this transitional time (i.e., during the duration of compensating procedure 9) exhibits a compensating effect in the form of a current delivery or a current consumption, i.e., during this transitional time the following equation applies:

$$I_B \neq 0.$$

Therefore, in the case in which $I_B=0$ applies, one proceeds in the following manner in order to differentiate between the state "energy store off" and the state "energy store on," where, however, $I_G = \Sigma I_V$ applies.

It is next checked whether a first supposition $I_B=0$ is satisfied within a tolerance band or not.

A second supposition is given in that a change in generator current $I_G$ by more than x Amp within y ms is present, where, for instance, x=10 and y=50 may apply. In this case, there follows an analysis of battery current $I_B$ within the transitional phase with respect to the compensating effect, i.e., a current consumption or a current delivery of energy store 1.

If there is a compensating effect, it is recognized that energy store 1 is available, i.e., it is connected to electrical system 3 of the vehicle. If it is established that the current remains around zero within the tolerance threshold, energy store 1 shows no compensating effect at all, that is, energy store 1 is accordingly no longer connected to electrical system 3 of the vehicle.

A change in generator current $I_G$ may not necessarily only be driven by a usage change within electrical system 3 of the vehicle, but may also be forced as a result of the already mentioned superordinated control by an energy management system. The compensating effect of energy store 1 in the transitional phase, that is, during compensating procedure 9, may be observed in this case too, in an intact electrical system 3. Knowledge of the sum of the user currents, that is, $\Sigma I_V$, is not required in this method.

With regard to the operating variables represented in FIGS. 1 and 2 and specified in electrical system 3, it should be noted that battery current $I_B$ assumes values <0 during discharge of the battery, and the value of generator current $I_G$ is >0 in response to delivery of electrical power into electrical system 3 of the vehicle. User current $I_V$ of an individual user $V_1$, $V_2$, $V_3$ ... $V_N$ is >0 in response to taking current from electrical system 3. By comparing the duration of time $T_V$ and time constant $T_G$ of generator 2 and its controller, it becomes clear that generator 2 is clearly more inert than the current step changes occurring in the electrical system in response to switching on and off the electrical loads. These show themselves more strongly the greater the electrical loads, which are switched on and off within the vehicle's electrical system 3 during the operation of the motor vehicle, e.g., the switching on and off of a rear window heater.

In the case where $I_G = \Sigma I_V$ applies, a case by case decision has to be made to recognize whether the state "energy store off" or "energy store on" exists. The first supposition $I_B=0$ should always be fulfilled for itself, and represents a necessary condition for the state "energy store off." If $I_B=0$, the vehicle's battery may be disconnected from the electrical system, but does not have to be. Thus, for example, $I_B=0$ may also occur in the stationary state. This means that, in this case, the compensation procedure is additionally evaluated, but only if the first supposition is in effect, that is, $I_B=0$.

What is claimed is:

1. A method for detecting a state of an electrical connection of a battery to a vehicle's electrical system, comprising:
   recording, in an approximately synchronous manner, operating variables including a battery current and a generator current of a generator coupled to the electrical system; and
   ascertaining the value of the battery current when a change occurs in the generator current of the generator during a specified transitional period, whereby a compensating effect of the battery current in the form of one of a current supply and a current consumption is ascertained;
   wherein the transitional period is equivalent to a characteristic time constant of the generator and a controller associated with the generator.

2. The method as recited in claim 1, wherein, if the ascertained value of the battery current is substantially zero, the ascertained value is checked against a tolerance range.

3. The method as recited in claim 1, wherein the values of the battery current and the generator current are recorded cyclically at a time interval of several 10 ms.

4. A method for detecting a state of an electrical connection of a battery to a vehicle's electrical system, comprising:
   recording, in an approximately synchronous manner, operating variables including a battery current and a generator current of a generator coupled to the electrical system; and
   ascertaining a value of the battery current when a change occurs in the generator current of the generator during a specified transitional period, whereby a compensating effect of the battery current in the form of one of a current supply and a current consumption is ascertained;
   wherein, if the generator current is changed by a predetermined current amount during a predetermined time span, an analysis of the battery current during the specified transitional period is made.

5. The method as recited in claim 4, wherein the existence of the compensating effect of the battery indicates an electrical connection of the battery to the electrical system.

6. The method as recited in claim 4, wherein, if the ascertained value of the battery current is substantially zero and within a tolerance range, a conclusion is made that the battery is electrically disconnected from the electrical system.

7. The method as recited in claim 4, wherein the predetermined current amount is greater than 5 Amps and less than 150 Amps, and wherein the predetermined time span is less than the characteristic time constant of the generator and the controller associated with the generator.

8. The method as recited in claim 4, wherein the change in the generator current is one of: a) caused by switching on and off of at least one electrical load within electrical system; and b) impressed by a superordinated controller.

9. The method as recited in claim 4, wherein, if the ascertained value of the battery current is substantially zero, the ascertained value is checked against a tolerance range.

10. The method as recited in claim 4, wherein the values of the battery current and the generator current are recorded cyclically at a time interval of several 10 ms.

\* \* \* \* \*